(12) United States Patent
Tchaaouaou et al.

(10) Patent No.: US 10,601,166 B2
(45) Date of Patent: Mar. 24, 2020

(54) ELECTRICAL HARNESS CONNECTION BOARD

(71) Applicant: Safran Electrical & Power, Blagnac (FR)

(72) Inventors: Ismaïl Tchaaouaou, Blagnac (FR); Frédéric Colin, Plaisance du Touch (FR)

(73) Assignee: Safran Electrical & Power, Blagnac (FR)

( * ) Notice: Subject to any disclaimer, the term of this patent is extended or adjusted under 35 U.S.C. 154(b) by 0 days.

(21) Appl. No.: 16/073,188

(22) PCT Filed: Jan. 27, 2017

(86) PCT No.: PCT/FR2017/050199
§ 371 (c)(1),
(2) Date: Jul. 26, 2018

(87) PCT Pub. No.: WO2017/129925
PCT Pub. Date: Aug. 3, 2017

(65) Prior Publication Data
US 2019/0036269 A1    Jan. 31, 2019

(30) Foreign Application Priority Data

Jan. 28, 2016 (FR) ...................................... 16 50702

(51) Int. Cl.
*H01R 13/518* (2006.01)
*H01R 13/621* (2006.01)
*H01R 13/639* (2006.01)

(52) U.S. Cl.
CPC ......... *H01R 13/518* (2013.01); *H01R 13/621* (2013.01); *H01R 13/639* (2013.01); *B64D 2221/00* (2013.01)

(58) Field of Classification Search
CPC .. H01R 13/518; H01R 13/621; H01R 13/639; H01R 13/6397; H05K 7/1412
See application file for complete search history.

(56) References Cited

U.S. PATENT DOCUMENTS

| | | | | |
|---|---|---|---|---|
| 2,417,369 A | * | 3/1947 | Luhn .................... | H01R 13/518 439/376 |
| 3,576,520 A | * | 4/1971 | Stauffer .................. | H01R 9/26 439/716 |
| 3,648,219 A | * | 3/1972 | Goldman ............. | H01R 13/518 439/157 |

(Continued)

FOREIGN PATENT DOCUMENTS

FR        2 998 442 A1    5/2014

*Primary Examiner* — Oscar C Jimenez
(74) *Attorney, Agent, or Firm* — Blank Rome LLP

(57) ABSTRACT

An electrical board for connecting two electrical harnesses to each other includes a module holder and at least one connector module to establish the connection between the two electrical harnesses, said connector module comprising a base engaged with the module holder, a perforated core extending the base and allowing connection of the two harnesses to each other via plugs. The module holder includes
  a fixed jaw,
  a movable jaw mounted to pivot on the fixed jaw, and
  locking means for holding the mobile jaw in the closed position.

13 Claims, 3 Drawing Sheets

(56) References Cited

U.S. PATENT DOCUMENTS

| | | | | |
|---|---|---|---|---|
| 4,674,814 | A * | 6/1987 | Hoshino | H01R 13/62 439/372 |
| 5,342,203 | A | 8/1994 | Perretta et al. | |
| 5,643,014 | A * | 7/1997 | Filus | H01R 13/518 439/680 |
| 5,725,397 | A * | 3/1998 | Fukamachi | H01R 13/514 439/596 |
| 5,741,160 | A * | 4/1998 | Arnold | H01R 13/514 439/701 |
| 6,004,162 | A * | 12/1999 | Harting | H01R 13/518 439/532 |
| 6,685,510 | B1 * | 2/2004 | Wu | H01R 13/514 439/579 |
| 7,352,947 | B2 * | 4/2008 | Phung | G02B 6/4459 248/49 |
| 7,534,958 | B2 * | 5/2009 | McNutt | G02B 6/3897 174/101 |
| 2002/0146931 | A1 * | 10/2002 | Richmond | H01R 13/6453 439/488 |
| 2010/0220967 | A1 * | 9/2010 | Cooke | G02B 6/3897 385/135 |
| 2010/0227500 | A1 * | 9/2010 | Shih | H01R 13/518 439/540.1 |
| 2011/0129186 | A1 * | 6/2011 | Lewallen | G02B 6/3825 385/59 |
| 2012/0003868 | A1 * | 1/2012 | Daugherty | H01R 13/6315 439/540.1 |
| 2014/0141644 | A1 | 5/2014 | Casse et al. | |
| 2017/0069998 | A1 * | 3/2017 | Herbrechtsmeier | H01R 13/518 |
| 2018/0309227 | A1 * | 10/2018 | Diessel | H01R 13/514 |

\* cited by examiner

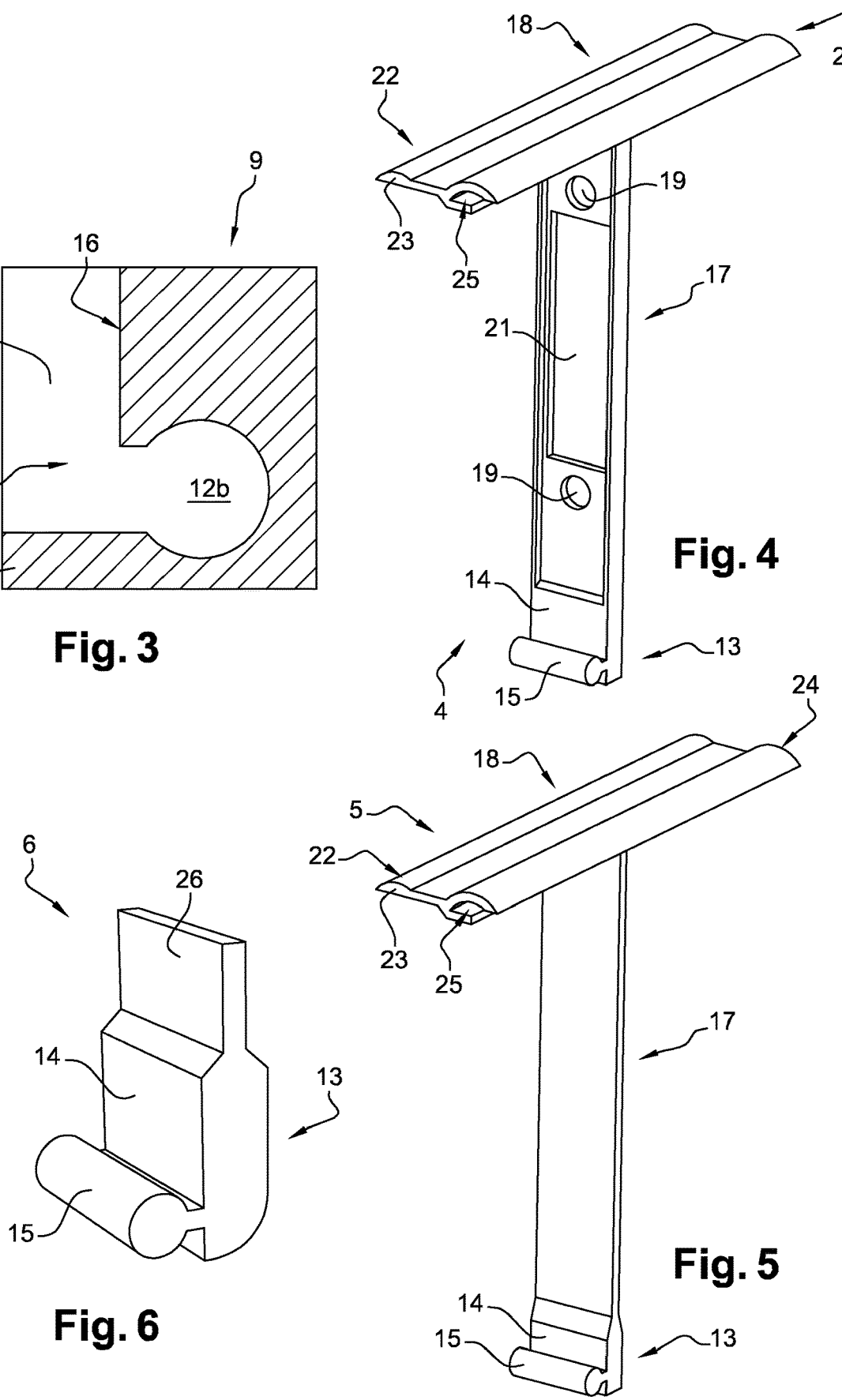

ELECTRICAL HARNESS CONNECTION BOARD

CROSS-REFERENCE TO RELATED APPLICATIONS

This application is a national stage of International Application No. PCT/FR2017/050199, filed on Jan. 27, 2017, which claims the benefit of French Patent Application No. 1650702, filed on Jan. 28, 2016, the contents of each of which are incorporated herein by reference.

TECHNICAL FIELD

The present invention relates to an electrical board (or plate) for connecting two electrical harnesses to each other, specifically in an aircraft.

BACKGROUND

In order to facilitate their manufacture, aircraft are built in sections that are abutted to one another and transported to the assembly site.

Each section comprises a structural portion, a covering and a transmission circuit, both fluidic and energetic, such as an electrical circuit. The electrical circuit consists of different electrical harnesses, each equipped with several electrical cables.

When assembling two sections together, the electrical harnesses of a first section need to be connected to the electrical harnesses of a second section. For this purpose, it is known to use either a connection rack comprising a metal plate serving as a support for each of the harnesses and allowing connection of the two harnesses to each other, or electrical terminals equipped with studs on which lugs integral with the harnesses are mounted.

Safety standards require that at the level of the connection of two harnesses to each other, protection against the flow of water is provided, so as to prevent the flow of water on the connection between the two harnesses. A known protection adopts the form of an added metal sheet, welded or bolted to the metal plate used to support the harnesses.

Another standard requires that the connection plates provide additional connection spaces for connecting additional harnesses, for example to accommodate addition of a harness not initially planned.

Such an installation makes it possible to connect two harnesses together while complying with the various existing standards. It nevertheless suffers from a number of drawbacks.

Firstly, use of a metallic material weighs down the aircraft to the detriment of its fuel consumption. This increase in weight is not compensated for either by the additional spaces available, since they cannot in fact be used owing to the fact that they must remain free for possible connection of additional harnesses.

Secondly, installation of the protective sheet proves particularly difficult given the limited space in which the assembly operators can use their tools. Installation of the sheet is particularly difficult when the sheet is added by welding to the metal plate.

Finally, the design of each board is different depending on the maximum number of harnesses to be connected. Thus, a board is sometimes redesigned because too few connection positions have been planned in relation to the number of harnesses to be connected.

SUMMARY

The invention more particularly aims at providing a simple, efficient and cost-effective solution to this problem.

For this purpose, the invention firstly provides for an electrical board for connecting two electrical harnesses to each other, wherein said board comprises a module holder and at least one connector module to establish the connection between the two electrical harnesses. The connector module comprises a base engaged with the module holder, a perforated core extending the base and allowing connection of the two harnesses to each other via plugs, characterised in that the module holder comprises:
 a fixed jaw;
 a movable jaw mounted to pivot on the fixed jaw between a closed position in which the movable jaw is against the fixed jaw and an open position in which the movable jaw is spaced apart from the fixed jaw, and locking means for holding the mobile jaw in the closed position.

The fixed jaw may comprise an elongated groove capable of longitudinally receiving, by detachable engagement, the base of several connector modules arranged side by side, wherein the movable jaw extends along said groove in the closed position to then block there the module(s) received therein.

Said jaw may extend along an axis which is the pivot axis of the movable jaw in relation to the fixed jaw.

Furthermore, the connector module may comprise a cover covering the core, to protect the connection of two electrical harnesses against splashes of water. Advantageously, the cover is opposite the base and substantially perpendicular to the core of the connector module.

A board of this kind offers a saving in weight, since the connector modules are added to the module holder depending on the number of harnesses to be connected. Hence, the board is scalable according to needs and modules may be added or removed so that the board includes as many connector modules as there are connections to be made.

Advantageously, the core of the connector module comprises at least two attachment holes for fixing the plugs of one harness to the other on the one hand and to the connector module on the other hand, for example by means of at least one linking device.

The number of holes made in the core will of course depend on the number of attachment points of the plugs and a plug may have more than two attachment points, for example three, four or even more. Furthermore, screw/nut systems can be replaced with snap-fitting means that offer the advantage of being usable without the use of tools such as wrenches or screwdrivers.

The harnesses are then integral with each other to allow transmission of electric signals from one harness to another, but also to the connector module so that the harnesses are stationary in relation to the aircraft.

According to one embodiment, the board also comprises at least one segregation module comprising a base, a solid core and an cover and/or at least one filler module comprising a base and a flange extending the base.

The segregation modules provide a physical barrier between two adjacent harnesses so as to avoid interference between the two harnesses or create separation between two individual circuits.

The segregation modules are mounted on the module holder in such a way that the module holder does not become clogged, but can also be replaced with connector modules or segregation modules if necessary.

Advantageously, the covers of each connector module and/or segregation module comprise a first longer side with an excess thickness and a second longer side, opposite the first, in the form of an open cavity capable of receiving the excess thickness of an adjacent connector module or segregation module.

The covers of the two connector modules and/or segregation modules are in this case interlocked with one another so as to provide a seal between the modules designed to protect the harnesses from any splashes of water.

Preferably, the base of the modules consists of a body and a pin protruding from the body.

This specific architecture allows the different modules to be securely accommodated in the module holder so that they have very little or no freedom.

Furthermore, the module holder may feature a frame on which the fixed jaw is mounted when the fixed jaw cannot be mounted directly on the aircraft structure. The frame may also be designed to receive several fixed jaws.

Preferably, the groove is substantially L-shaped, thereby integrating a slot (for example 12a of FIG. 3) for receiving the body elongated by a transverse recess (for example 12b of FIG. 3) for receiving the pin, said pin of each base being accommodated in the groove recess when the groove receives several modules side by side.

Thus, the modules are perfectly held on the module holder, thereby creating a robust assembly.

According to a preferred embodiment, the modules and module holder are made of thermoplastic material to limit the weight of the board.

Secondly, the invention provides for an assembly comprising:
two electrical harnesses, each comprising a plug for connection of the two harnesses to each other;
a connection board of the aforementioned type and
at least one screw/nut system for fixing the plugs of the two harnesses together.

Such an assembly allows fast and secure connection of two sections and more particularly the energy connection of two sections when fitting together two sections of an aircraft.

BRIEF DESCRIPTION OF THE DRAWINGS

The invention will be better understood, if need be, and other details, characteristics and advantages of the invention will appear upon reading the following description given by way of a non restrictive example while referring to the appended drawings wherein:

FIG. 3 is a diagrammatic view showing an L-shaped groove of the module holder to allow attachment of the modules;

FIG. 4 is a perspective view of a connector module of the board in FIG. 1;

FIG. 5 is a perspective view of a segregation module of the board in FIG. 1;

FIG. 6 is a perspective view of a filler module of the board in FIG. 1;

DETAILED DESCRIPTION

Figure 1:
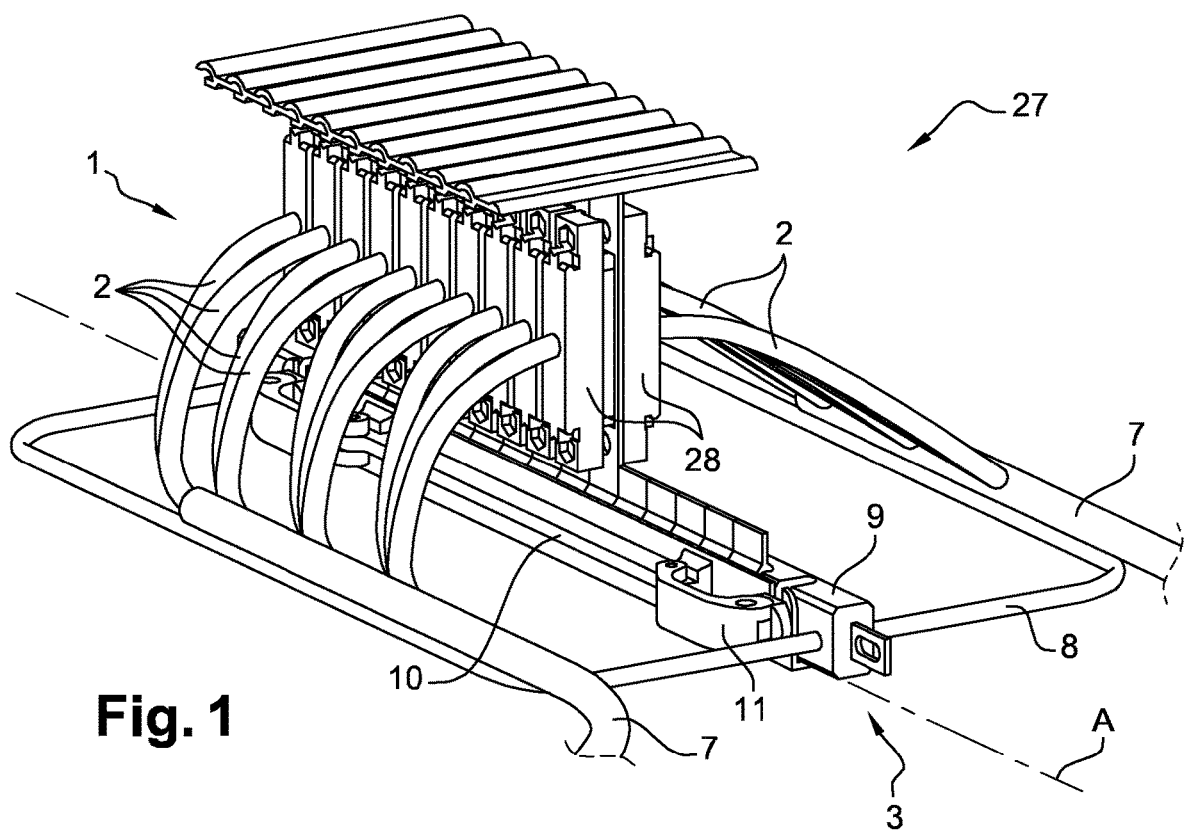
FIG. 1 is a perspective view of a board for connecting two electrical harnesses to each other.

Illustrated in FIG. 1 is an electrical board 1 allowing connection to each other of at least two electrical harnesses.

Figure 2:
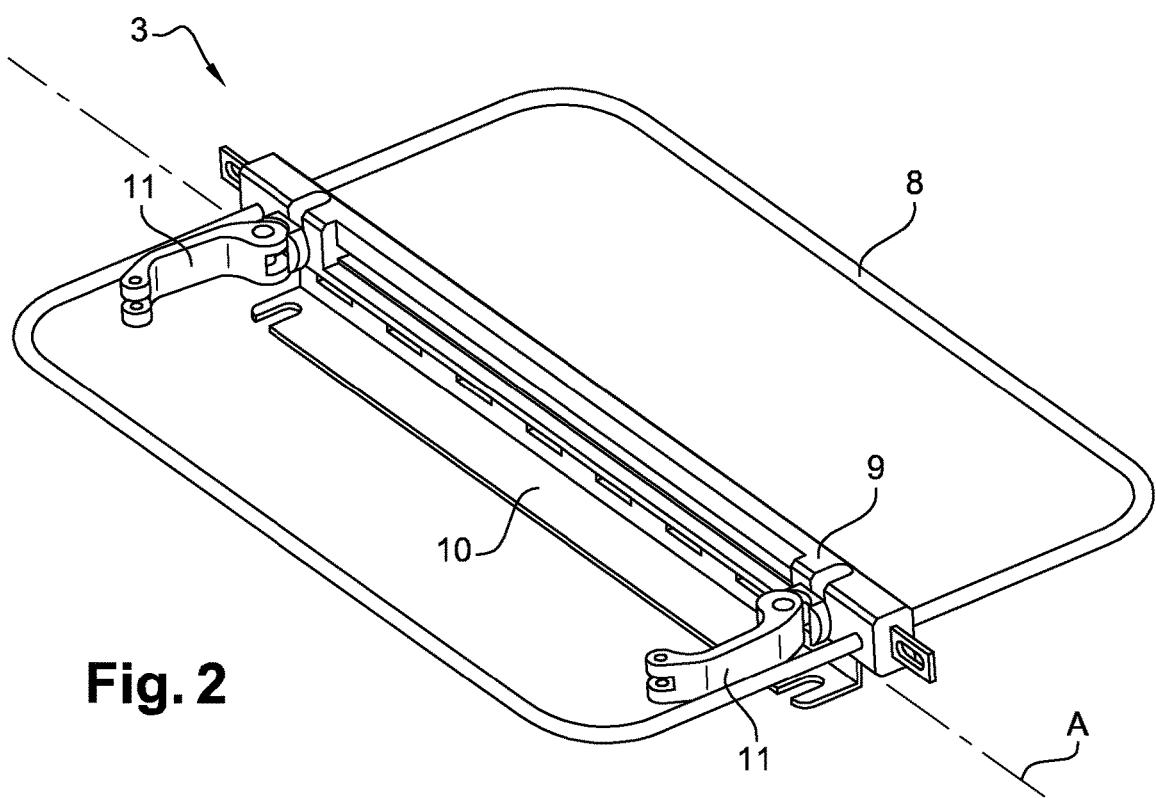
FIG. 2 is a perspective view of a module holder of the board in FIG. 1.

The board 1 comprises a module holder 3, illustrated in FIG. 2 and different modules 4, 5, 6 capable of being mounted on the module holder 3, i.e. a connector module 4, a segregation module 5 and a filler module 6 respectively, represented in FIGS. 3 to 5.

The electrical boards 1 are generally used at the ends of the sections of an aircraft to allow connection and continuity of the energy transmission circuits, particularly of the electrical circuits 7.

With reference to FIG. 2, the module holder 3 comprises:
a fixed jaw 9 mounted on the frame 8;
a movable jaw 10 mounted to pivot around an axis A on the fixed jaw 9, between a closed position in which the movable jaw 10 is against the fixed jaw 9 and an open position in which the movable jaw 10 is spaced apart from the fixed jaw 9;
locking means 11 for holding the mobile jaw 10 in the closed position and possibly
a frame 8 on which the fixed jaw 9 is mounted.

The frame 8, adopting the form of a wire structure forming an interface between the structure of the aircraft and the fixed jaw 9, can be used for example when the fixed jaw 9 cannot be attached to a component of the structure of the aircraft. The frame 8 acts in this case as an interface for attaching one or several fixed jaw(s) 9 to the structure.

In this particular case, the locking means 11 are cams. Other means of holding the movable jaw 10 in the closed position could however be used.

FIG. 3 shows diagrammatically a substantially L-shaped groove 12 created in the fixed jaw 9, with this groove 12 being capable of receiving the different modules 4, 5, 6 as described in detail below.

The board 1 comprises three different types of module 4, 5, 6, i.e. a connector module 4 illustrated in FIG. 4, a segregation module 5 represented in FIG. 5 and a filler module 6 represented in FIG. 6.

The three types of module 4, 5, 6 have in common a base 13 that engages in the module holder 3 and differ by a part of the module that extends the base 13.

The base 13 of the modules comprises a body 14 and a pin 15 protruding from the body 14, wherein the pin 15 is accommodated in the shortest portion of the L-shaped groove 12 and the body 14 rests against a vertical surface 16 delimiting the shortest portion of the L.

In order to allow the modules 4, 5, 6 to be snap-fitted on to the fixed jaw 9, the shortest part of the L has a shape that matches the pin 15. Hence, by elastic deformation of a lower portion 9a of the fixed jaw 9, the pin 15 is held in the L-shaped groove 12. This results in easy assembly and disassembly of the modules 4, 5, 6 on the fixed jaw 9, which facilitates the work of the operators thereby improving modularity of the board 1.

As can be seen in the figures, the body 14 is substantially parallelepipedal and the pin 15 is substantially oval in shape. Other specific shapes are however possible.

The parts specific to each of the modules 4, 5 and 6 will now be described.

The connector module 4 comprises a perforated core 17, extending the base 13 and allowing connection of two harnesses 2 to each other, as well as an cover 18 substantially perpendicular to the core 17 and opposite the base 13. The cover 18 serves to protect the core 17 and particularly the connection between two harnesses, against drops of water or drops of condensation originating from components located above the harnesses 2.

Advantageously, the perforated core 17 of the connector module 4 comprises at least two attachment holes 19 for fixing the harnesses 2 to each other on the one hand and to the connector module 4 on the other hand, for example by means of screw/bolt links 20.

Furthermore, the core 17 of the connector modules comprises a window 21 serving to establish the electrical connection of the harnesses 2 to each other.

The segregation modules 5 are similar to the connector modules 4, the sole difference being that their core 17 does not have attachment holes 19 or a window 21. Hence, the core 17 of the segregation modules 5 is solid instead of being perforated like the core 17 of the connector modules 4.

The cover 18 of each connector module 4 and segregation module 5 comprises a first longer side 22 with an excess thickness 23 and a second longer side 24, opposite the first, in the form of an open cavity 25 capable of receiving the excess thickness 23 of an adjacent connector module 4 or segregation module 5.

Figure 7:
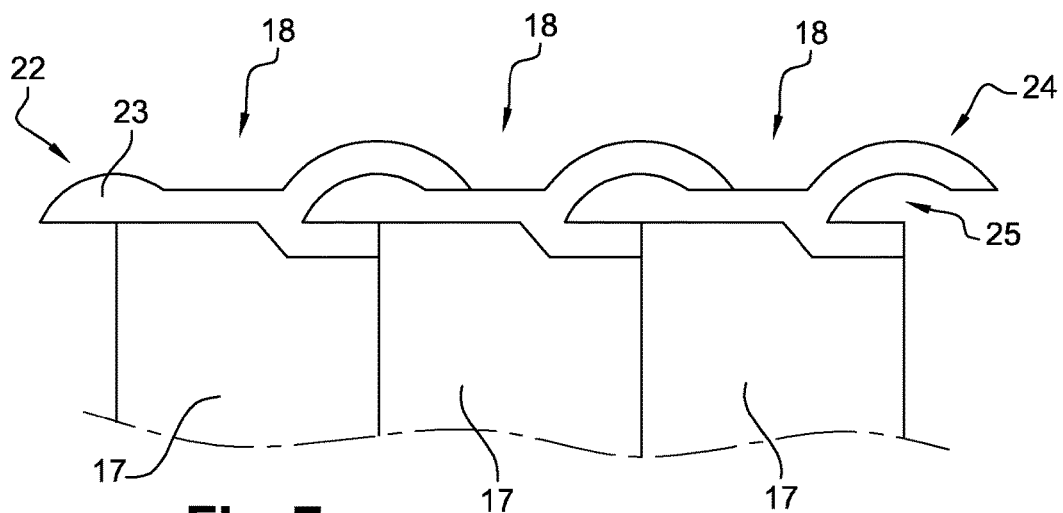
FIG. 7 is a front view showing the interconnection of several connector modules and/or segregation modules and FIG. 8 is a perspective view showing an electrical board on which two separate circuits are connected, each comprising several electrical harnesses.

FIG. 7 shows the interaction between the covers 18 of several adjacent connector modules 4 or segregation modules 5. Thus, if water arrives on top of the covers 18, it will not be able to pass through the covers 18 owing to the absence of an opening allowing it to pass through; the water will subsequently run over the covers 18 thereby protecting the connections between two harnesses 2.

Finally, the filler modules 6 comprise a simple flange 26, extending the base 13 substantially in the direction of extension of the base 13.

Each of these modules 4, 5, 6 has a specific role. The 4 connector modules allow connection between two harnesses 2 whereas the segregation modules 5 allow separation between two adjacent harnesses 2 of the same circuit 7 or two separate circuits 7. Finally, the filler modules 6 serve a filling function to prevent the L-shaped groove 12 of the fixed jaw 9 of the module holder 3 from clogging.

According to an advantageous embodiment, the module holder 3 and the modules 4, 5, 6 are made from a thermoplastic material that offers a good compromise between mechanical strength and lightness.

Figure 8:
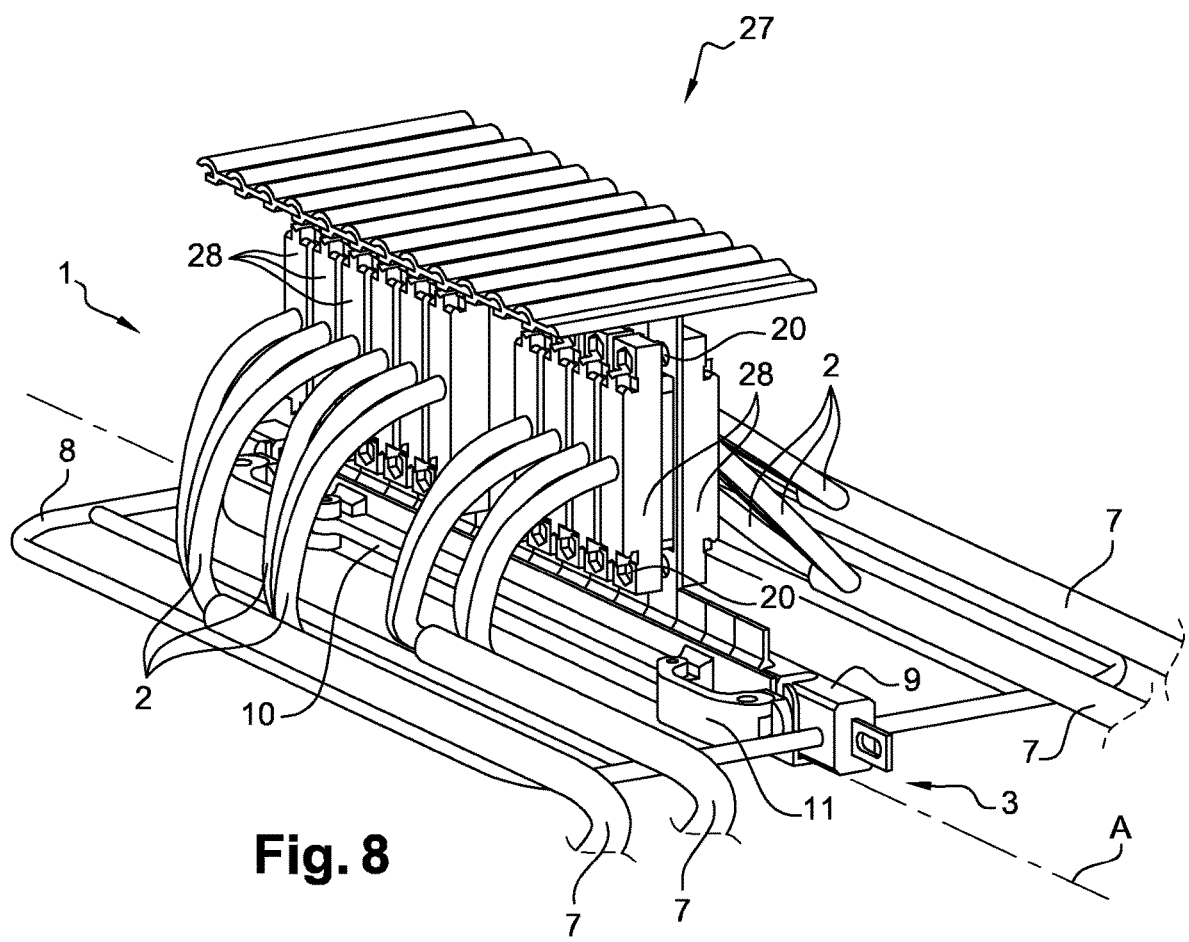

Illustrated in FIG. 8 is an assembly 27 comprising:
two electrical harnesses 2, each comprising a plug 28 for connection of the two harnesses 2 to each other;
a connection board 1 as described above and
at least one linking device 20 for fixing the plugs 28 of the two harnesses 2 together.

Advantageously, the linking device 20 is a screw/nut system 20, but could involve tabs that snap-fit in an opposite plug 28 and/or in the connector modules 4.

More specifically, two electrical circuits 7 are connected on the board 1, said two circuits 7 being separated from each other by a segregation module 5.

It can be seen that in this assembly 27, all the types of module 4, 5, 6 are mounted on the module holder 3. Each of the filler modules 6 can, if necessary, be replaced by a connector module 4 or a filler module 5 so as to increase the connection possibilities of the harnesses 2.

Through the attachment holes 19 of the 4 connector modules, the devices 20 not only serve to fix the plugs 28 of the harnesses 2 together, but also to fix each of the harnesses 2 on the connector module 4 by tightening each of the plugs 28 on the connector modules 4.

The board 1 which has just been described offers great modularity for connecting two harnesses 2 to each other, but also good fixing safety since each of the harnesses 2 can be separated from the others by a segregation module 5, in particular to avoid interference between the harnesses 2.

Furthermore, use of modules 4, 5, 6 engageable between the two jaws 9, 10 of the module holder 3 facilitates the operations of connecting or disconnecting harnesses 2, since the modules 4, 5, 6 are interchangeable and a temporary connection for a repair or for addition of a new circuit 7 can be quickly and easily established.

Finally, use of a thermoplastic material makes it possible on the one hand to limit the weight of the board 1, but also better control the manufacturing tolerances of its constituent components, so that the assembly of different modules 4, 5, 6 on the module holder 3 ensures good protection of the harnesses 2.

The invention claimed is:

1. An electrical board for connecting two electrical harnesses to each other, wherein said board comprises a module holder and a plurality of connector modules to establish the connection between the two electrical harnesses, each connector module comprising a base engaged with the module holder, a perforated core extending the base and allowing connection of the two harnesses to each other via plugs, wherein the module holder comprises:
a fixed jaw;
a movable jaw mounted to pivot on the fixed jaw between a closed position in which the movable jaw is against the fixed jaw and an open position in which the movable jaw is spaced apart from the fixed jaw, and
locking means for holding the movable jaw in said closed position against the fixed jaw and block there the respective bases of the respective connector modules, and wherein the fixed jaw comprises an elongated groove capable of longitudinally receiving, by a detachable engagement, the respective bases of the respective connector modules arranged side by side, and wherein the movable jaw extends along said groove in the closed position to then block there each connector module received therein.

2. The board according to claim 1, wherein each connector module comprises a cover covering the perforated core to protect the connection of two electrical harnesses.

3. The board according to claim 1, wherein the perforated core of each connector module comprises at least two attachment holes for fixing the plugs of each harness to the other on the one hand and to the connector module on the other hand.

4. The board according to claim 1, further comprising at least one segregation module comprising a base, a solid core and a cover and/or at least one filler module comprising a base and a flange extending the base.

5. The board according to claim 4, wherein the respective covers of each connector module and the at least one segregation module comprise a first longer side with an excess thickness and a second longer side, opposite the first longer side, the second longer side having an open cavity capable of receiving the excess thickness of an adjacent one of said plurality of connector modules or said at least one segregation module.

6. The board according to claim 1 wherein respective bases of the respective connector modules each comprise a body and a pin protruding from the body.

7. The board according to claim 6, wherein the groove is substantially L-shaped, thereby integrating a slot for receiving the body elongated by a transverse recess for receiving the pin, said pin of each base being accommodated in the recess of the groove when the groove receives several of said connector modules side by side.

8. The board according to claim 1, wherein the module holder further comprises a frame on which the fixed jaw is mounted.

9. An assembly comprising:
two electrical harnesses, each comprising a plug for connection of the two harnesses to each other;
the connection board according to claim 1, and
at least one linking device for fixing the plugs of the two harnesses together.

10. An electrical board for connecting two electrical harnesses to each other, wherein said board comprises a module holder and a plurality of connector modules to establish the connection between the two electrical harnesses, each connector module comprising a base engaged with the module holder, a perforated core extending the base and allowing connection of the two harnesses to each other via plugs, wherein the module holder comprises:
a fixed jaw;
a movable jaw mounted to pivot on the fixed jaw between a closed position in which the movable jaw is against the fixed jaw and an open position in which the movable jaw is spaced apart from the jaw, and
locking means for holding the movable jaw in said closed position against the fixed jaw and block there the bases of the respective connector modules,
and wherein the fixed jaw comprises an elongated groove capable of longitudinally receiving, by a detachable engagement, the bases of the respective connector modules arranged side by side,
and wherein the movable jaw extends along said groove in the closed position to then block there the connector modules received therein,
and wherein each base of the respective connector modules comprises a body and a pin protruding from the body,
and wherein the elongated groove is substantially L-shaped, thereby integrating a slot for receiving the respective bodies elongated by a transverse recess for receiving the respective pins, the pin of each base being accommodated in the recess of the groove when the groove receives several connector modules side by side.

11. An electrical board for connecting two electrical harnesses to each other, wherein said board comprises a module holder and at least one connector module to establish the connection between the two electrical harnesses, said at least one connector module comprising a base engaged with the module holder, a perforated core extending the base and allowing connection of the two harnesses to each other via plugs, wherein the module holder comprises:
a fixed jaw;
a movable jaw mounted to pivot on the fixed jaw between a closed position in which the movable jaw is against the fixed jaw and an open position in which the movable jaw is spaced apart from the jaw, and
locking means for holding the movable jaw in said closed position against the fixed jaw and block there the base of the at least one connector module,
and wherein said at least one connector module comprises a cover covering the perforated core to protect the connection of two electrical harnesses,
and wherein the electrical board further comprises at least one segregation module comprising a base, a solid core and a cover and/or at least one filler module comprising a base and a flange extending the base,
and wherein the respective covers of said at least one connector module and said at least one segregation module comprise a first longer side with an excess thickness and a second longer side, opposite the first longer side, the second longer side having an open cavity capable of receiving the excess thickness of said at least one connector module or of said at least one segregation module.

12. The board according to claim 11, comprising a plurality of said connector modules, and wherein the fixed jaw comprises an elongated groove capable of longitudinally receiving, by a detachable engagement, the base of several of said connector modules arranged side by side, and wherein the movable jaw extends along said groove in the closed position to then block there the connector modules received therein.

13. The board according to claim 11, wherein each base of the respective connector modules comprises a body and a pin protruding from the body, wherein the fixed jaw comprises an elongated groove capable of longitudinally receiving, by a detachable engagement, the bases of the respective connector modules arranged side by side, wherein the movable jaw extends along said groove in the closed position to then block there the connector modules received therein, wherein each base of the respective connector modules comprises a body and a pin protruding from the body, and wherein the elongated groove is substantially L-shaped, thereby integrating a slot for receiving the respective bodies elongated by a transverse recess for receiving the respective pins, the pin of each base being accommodated in the recess of the groove when the groove receives several connector modules side by side.

* * * * *